United States Patent
Arndt et al.

(10) Patent No.: US 9,823,072 B2
(45) Date of Patent: Nov. 21, 2017

(54) DRIVE SIGNAL CONTROL FOR RESONATING ELEMENTS

(71) Applicant: Apple Inc., Cupertino, CA (US)

(72) Inventors: Gregory B. Arndt, Campbell, CA (US); Christopher C. Painter, Dublin, CA (US)

(73) Assignee: Apple Inc., Cupertino, CA (US)

( * ) Notice: Subject to any disclaimer, the term of this patent is extended or adjusted under 35 U.S.C. 154(b) by 245 days.

(21) Appl. No.: 14/866,561

(22) Filed: Sep. 25, 2015

(65) Prior Publication Data

US 2017/0089701 A1 Mar. 30, 2017

(51) Int. Cl.
  *G01C 19/567* (2012.01)
  *G01N 29/12* (2006.01)
(52) U.S. Cl.
  CPC ................. *G01C 19/567* (2013.01)
(58) Field of Classification Search
  CPC . G01C 19/567; G01N 29/12; G01N 2291/101
  USPC .......................................................... 73/579
  See application file for complete search history.

(56) References Cited

U.S. PATENT DOCUMENTS

| | | | | |
|---|---|---|---|---|
| 6,925,876 B2* | 8/2005 | Babala | ................ | B60R 21/0132 73/504.12 |
| 7,848,894 B2* | 12/2010 | Motzer | ................ | G01N 29/043 702/150 |
| 2004/0149035 A1* | 8/2004 | Acar | ..................... | B81B 3/0062 73/504.12 |
| 2007/0119258 A1* | 5/2007 | Yee | .................... | G01C 19/5684 73/649 |
| 2014/0305208 A1* | 10/2014 | Thiruvenkatanathan | | G01C 19/5719 73/504.12 |

* cited by examiner

*Primary Examiner* — J M Saint Surin
(74) *Attorney, Agent, or Firm* — Fish & Richardson P.C.

(57) ABSTRACT

In some implementations, a control system for a resonating element comprises: a resonating element being driven by an oscillating drive signal and configured to generate a sense signal proportional to an amplitude of motion; a phase comparator coupled to the resonating element and to an oscillating drive signal, the phase comparator configured to compare the sense signal and the oscillating drive signal and to generate an error signal proportional to the phase difference; an oscillator coupled to the phase comparator and configured for generating the oscillating drive signal, the oscillator configured to receive the error signal and to adjust a phase of the oscillating signal based on the error signal; and an automatic gain control coupled to the resonating element and the oscillator, the automatic gain control configured to adjust the gain of the oscillating drive signal based on the signal generated by the resonating element.

20 Claims, 3 Drawing Sheets

DRIVE SIGNAL CONTROL FOR RESONATING ELEMENTS

TECHNICAL FIELD

This disclosure relates generally to systems and methods for controlling resonating elements in electronic circuits, such as inertial sensors that include micro-electrical-mechanical systems (MEMS) technology.

BACKGROUND

A typical vibratory gyroscope that utilizes MEMS technology includes a proof mass that is suspended above a cavity in semiconductor substrate by a mechanical suspension system that includes flexible beams. The proof mass is driven into resonance in a drive direction by an external periodic electrostatic or electromagnetic force. When the gyroscope is subjected to an angular rotation, a sinusoidal Coriolis force is induced in a direction orthogonal to the drive-mode oscillation at the driving frequency. The Coriolis force is proportional to the amplitude of the drive motion and to precisely determine the rotation rate around the rotation axis, a feedback control system is necessary to assure a constant-amplitude oscillation of the proof mass in the drive direction. Since the output of the gyroscope is typically very small, the control system also forces the proof mass to vibrate at resonance to achieve maximum sensitivity.

Conventional gyroscopes use a self-oscillating loop architecture including several filtering stages and a phase-locked loop (PLL) to produce a clean signal with the same frequency as the drive frequency. The performance of these conventional gyroscopes, however, may be degraded due to noise and parasitic signals. Also, conventional gyroscopes can be more costly to manufacture due to the incorporation of complex filter stages.

SUMMARY

A drive signal control system and method for resonating elements is disclosed.

In some implementations, a control system for a resonating element comprises: a resonating element being driven by an oscillating drive signal and configured to generate a sense signal proportional to an amplitude of motion; a phase comparator coupled to the resonating element and to an oscillating drive signal, the phase comparator configured to compare the sense signal and the oscillating drive signal and to generate an error signal proportional to the phase difference; an oscillator coupled to the phase comparator and configured for generating the oscillating drive signal, the oscillator configured to receive the error signal and to adjust a phase of the oscillating signal based on the error signal; and an automatic gain control coupled to the resonating element and the oscillator, the automatic gain control configured to adjust the gain of the oscillating drive signal based on the signal generated by the resonating element.

In some implementations, a method of controlling a drive signal for a resonating element comprises: receiving a signal from a resonating element; comparing a phase of the signal with a phase of an oscillating drive signal; generating an error signal based on the comparing; adjusting a phase of the oscillating drive signal based on the error signal; adjusting a gain of the oscillating drive signal based on an amplitude of the received signal; and driving the resonating element to its resonant frequency using the oscillating drive signal.

In some implementations, an apparatus comprises: a motion sensor including a resonating element; a control system coupled to the resonating element and configured to: receive a signal from the resonating element; compare a phase of the signal with a phase of an oscillating drive signal; generate an error signal based on the comparing; adjust a phase of the oscillating drive signal based on the error signal; adjust a gain of the oscillating drive signal based on an amplitude of the received signal; and drive the resonating element to its resonant frequency using the oscillating drive signal.

Particular implementations disclosed herein provide one or more of the following advantages. The disclosed implementations provide a drive control system and method for resonating elements that reduces the need for complex filters while offering better noise and parasitic signal rejection, a potentially faster and more reliable start-up and an ability to record the drive frequency.

The details of the disclosed implementations are set forth in the accompanying drawings and the description below. Other features, objects and advantages are apparent from the description, drawings and claims.

DESCRIPTION OF DRAWINGS

The same reference symbol used in various drawings indicates like elements.

DETAILED DESCRIPTION

The example implementations disclosed below include a capacitive MEMS angular rate sensor (gyroscope) which includes a control system that assures constant-amplitude oscillation of the proof mass at the drive resonant frequency. The disclosed implementations, however, can be used with any sensor or circuit that includes a resonating element (e.g., a piezoelectric MEMS sensor) and where the frequency and amplitude of the drive signal is controlled.

Example Control System

Figure 1:
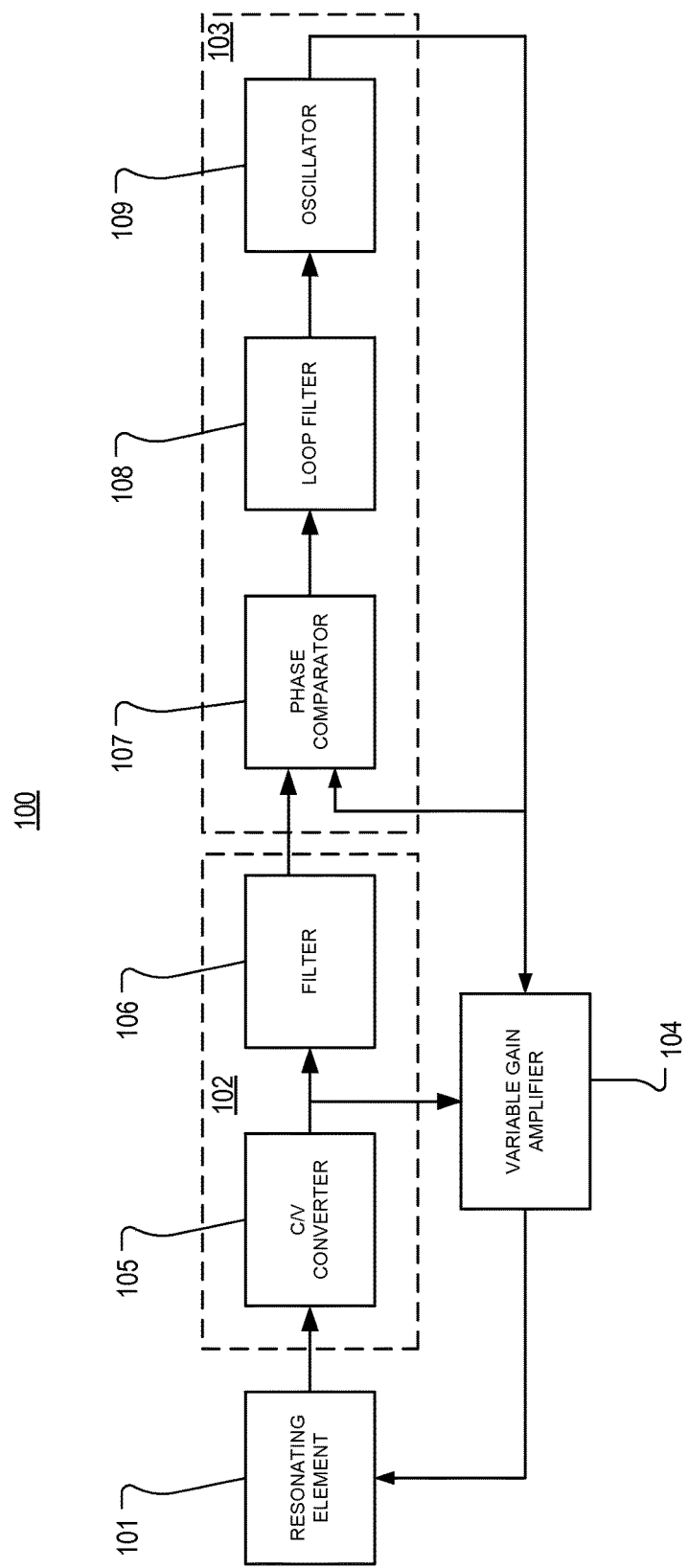
FIG. 1 is block diagram of an example control system for resonating elements.

FIG. 1 is block diagram of an example control system 100 for resonating elements. In some implementations, system 100 can include resonating element 101, signal conditioning circuit 102, drive signal generator 103 and automatic gain control (AGC) 104. System 100 provides advantages over conventional control systems for resonating elements by reducing the need for complex filters while offering better noise and parasitic signal rejection, a potentially faster and more reliable start-up and an ability to record the drive frequency.

In some implementations, signal conditioning circuit 102 can include capacitance-to-voltage (C/V) converter 105 and filter 106 and drive signal generator 103 includes phase comparator 107, loop filter 108 and oscillator 109. In the example shown resonating element 101 is a capacitive MEMS structure and C/V converter 105 converts a change in capacitance induced by resonating element 101 into a voltage signal. In other implementations, resonating element 101 is a piezoelectric MEMS structure. Filter 106 is an optional bandpass filter for conditioning the voltage signal output of C/V converter 105 (e.g., reduce out-of-band noise) before the voltage signal is input to phase comparator 107.

Phase comparator 107 compares the voltage signal output by C/V converter 105 (or the output of filter 106 if used) with an oscillating drive signal output by oscillator 109 and produces an error signal which is proportional to the phase difference of the input signals. The error signal is then filtered by loop filter 108 which provides a control signal to oscillator 109. The control signal causes oscillator 109 to adjust the phase of the oscillating drive signal by speeding up or slowing down the oscillating drive signal. The oscillating drive signal is looped back to the input of phase comparator 107 thereby creating a negative feedback loop. If the phases of the input signals to phase comparator 107 drift apart, the error signal will increase or decrease, and the control signal will drive the phase of the oscillating drive signal in the opposite direction to reduce the error.

In some implementations, oscillator 109 is a voltage controlled oscillator (VCO) and loop filter 108 is a low-pass filter. Loop filter 108 assures loop stability and reduces ripple in the error signal appearing at the output of phase comparator 107. The oscillating drive signal generated by oscillator 109 is input to AGC 104 together with the voltage signal output by C/V converter 105. AGC 104 adjusts the gain of the oscillating drive signal according to the output of C/V converter 105 so that the oscillating drive signal has a substantially constant amplitude. In some implementations, AGC 104 includes a variable gain amplifier (VGA).

Example Process

Figure 2:
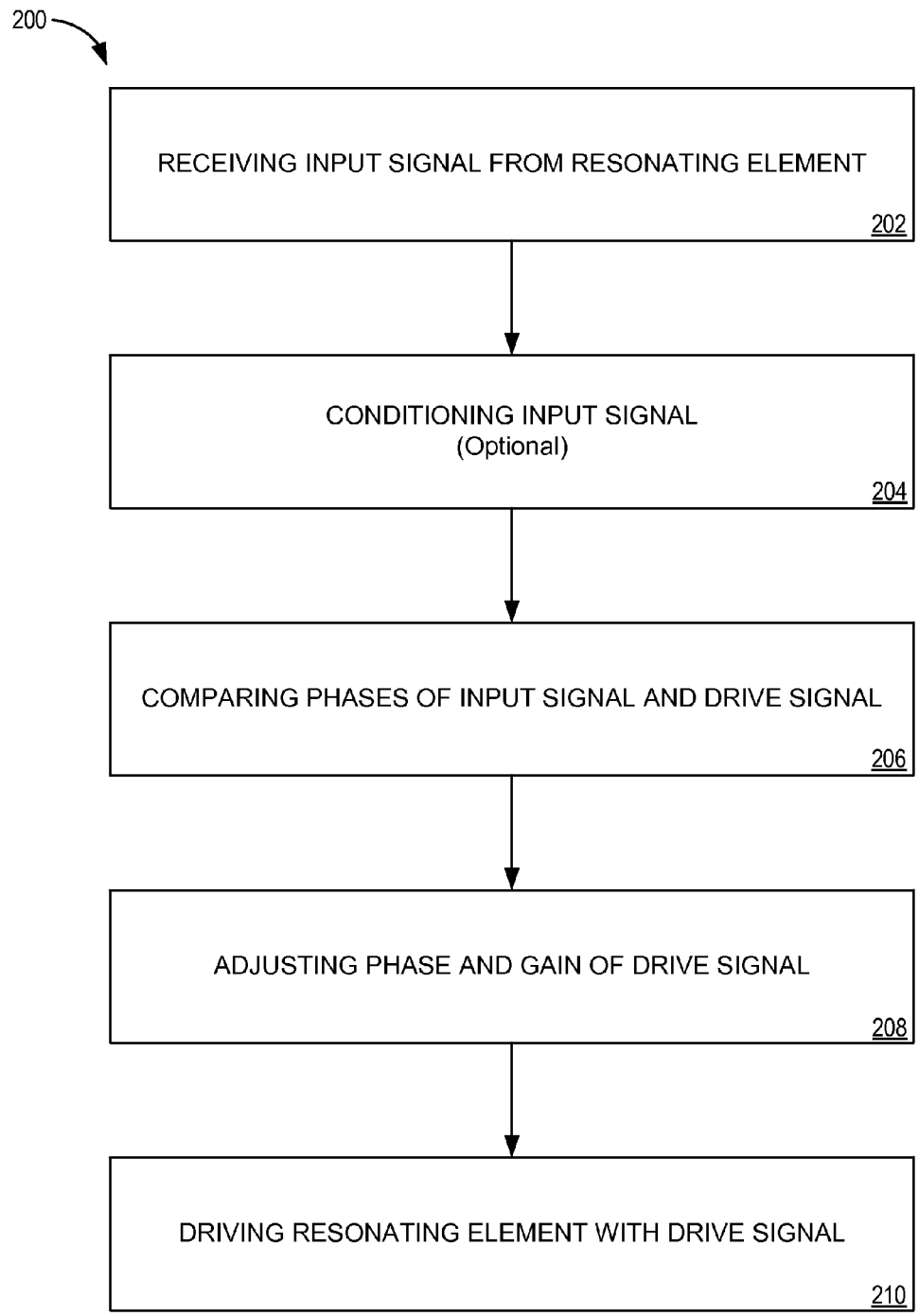
FIG. 2 is a flow diagram of an example process performed by the control system of FIG. 1.

FIG. 2 is a flow diagram of an example process 200 performed by control system 100 of FIG. 1. In some implementations, process 200 can begin by receiving an input signal from a resonating element being driven by an oscillating drive signal (202). The input signal can be, for example, a sense signal output by an inertial sensor (e.g., gyroscope). Optionally, the input signal can be conditioned (204). For example, if the resonating element is a capacitive MEMS structure, the input signal is a change in capacitance induced by the capacitance MEMS structure, which is converted to a voltage signal by a C/V converter. In some implementations, a bandpass filter can be applied to the voltage signal to reduce out-of-band noise on the voltage signal.

Process 200 can continue by comparing the phases of the input signal and the oscillating drive signal to generate an error signal proportional to the phase difference (206). The error signal is used to adjust the phase of the oscillating drive signal and the amplitude of the input signal is used to adjust the gain of the oscillating drive signal (208). For example, a VCO can generate the oscillating drive signal and adjust the phase of the oscillating drive signal based on a control signal. A VGA can adjust the gain of the oscillating drive signal based on the voltage signal output by the C/V converter so that the oscillating drive signal has a substantially constant amplitude. Process 200 can continue by driving the resonating element with the adjusted oscillating drive signal (210).

Figure 3:
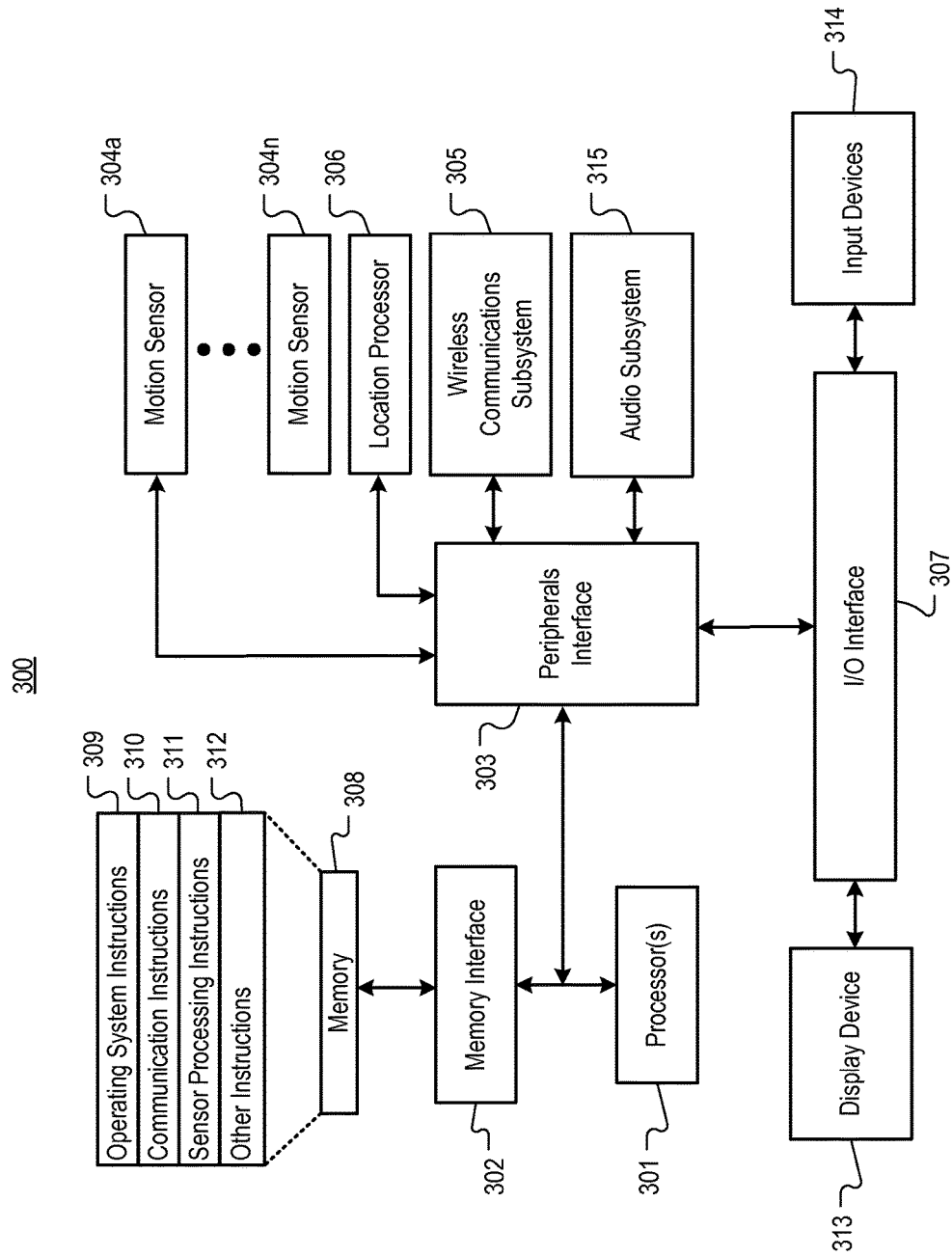
FIG. 3 is example apparatus that includes the control system, as described in reference to FIGS. 1-2.

FIG. 3 is an example apparatus that includes motion sensors 304a-304n some of which include a control system for resonating elements in motion sensors 304a-304n, as described in reference to FIGS. 1-2. In some implementations, the motion sensors 304a-304n can be implemented in an apparatus, such as smart phone, tablet computer, wearable computer and the like. The apparatus can have a system architecture 300 that includes processor(s), memory interface 302, peripherals interface 303, one or more motion sensors 304a-304n, wireless communication subsystem 306, audio subsystem 315, Input/Output (I/O) interface 307, memory 308, display device 313 and input devices 314.

Motion sensors 304a-304n (e.g., MEMS accelerometer, MEMS gyro) may be coupled to peripherals interface 303 to facilitate multiple motion sensing functionalities of the apparatus. In one implementation, one or more motion sensors include resonating elements and a control system for the resonating elements as described in reference to FIGS. 1 and 2. Location processor 305 can include a global navigation satellite system (GNSS) receiver. Wireless communications subsystem 306 may include radio frequency (RF) receivers and transmitters (or RF transceivers) and/or optical (e.g., infrared) receivers and transmitters. Wireless communication subsystem 306 can operate over a variety of networks, such as global system for mobile communications (GSM) network, GPRS network, enhanced data GSM environment (EDGE) network, IEEE 802.xx network (e.g., Wi-Fi, Wi-Max, ZigBee™), 3G, 4G, 4G LTE, code division multiple access (CDMA) network, near field communication (NFC) network, Wi-Fi Direct network and Bluetooth™ network.

I/O interface 307 may include circuitry and/or firmware for supporting wired mediums and implement various communication protocols and include ports for UART, Serial, USB, Ethernet, RS-232 and the like.

Memory interface 302 is coupled to memory 308. Memory 308 may include high-speed random access memory or non-volatile memory, such as one or more magnetic disk storage devices, one or more optical storage devices, or flash memory (e.g., NAND, NOR). Memory 308 may store operating system 309, such as Darwin, RTXC, LINUX, UNIX, OS X, iOS, WINDOWS, or an embedded operating system such as VxWorks. Operating system 309 may include instructions for handling basic system services and for performing hardware dependent tasks. In some implementations, operating system 309 may include a kernel (e.g., UNIX/LINUX kernel).

Memory 308 may also store communication instructions 310 to facilitate communicating with one or more additional devices in a network topology and one or more computers or servers over wired and wireless mediums. Communication instructions 310 can include instructions for implementing all or part of a wireless communications software stack.

Memory 308 may include sensor processing instructions 311 to facilitate motion sensor-related processing and functions on motion signals received from motion sensors 304a-304n. For example, processing instructions 311 can include instructions for implementing at least portions of a control system for resonating elements in one or more motion sensors, as described in reference to FIGS. 1 and 2.

Other instructions 312 can include instructions for a variety of applications that use the motion signals provided by motion sensors 304a-304n. For example, other instructions can include application instructions that take the motion signals from motion sensors 304a-304n and compute the current location, speed and orientation of the apparatus in a reference coordinate frame (e.g., geodetic, local level). The application instructions can display a map on display device 313 with a marker indicating the location of the apparatus along with other information such as turn-by-turn directions for a route. Audio subsystem 315 can provide speech output for the application that provides, for example, audible turn-by-turn directions.

Other applications can make other uses of motion signals from motion sensors 304a-304n and will benefit from motion signals that are less noisy and have less errors due to the mechanical filter designs disclosed herein. For example, an electronic pedometer application can benefit from improved motion signals provided by the mechanical filter designs disclosed herein.

While this document contains many specific implementation details, these details should not be construed as limitations on the scope of what may be claimed but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable sub combination. Moreover, although features may be described above as acting in certain combinations and even initially claimed as such, one or more features from a claimed combination can, in some cases, be excised from the combination, and the claimed combination may be directed to a sub combination or variation of a sub combination.

What is claimed is:

1. A control system for a resonating element, comprising:
the resonating element being driven by an oscillating drive signal and configured to generate a sense signal proportional to an amplitude of motion;
a phase comparator coupled to the resonating element and to an oscillating drive signal, the phase comparator configured to compare the sense signal and the oscillating drive signal and to generate an error signal proportional to the phase difference;
an oscillator coupled to the phase comparator and configured for generating the oscillating drive signal, the oscillator configured to receive the error signal and to adjust a phase of the oscillating signal based on the error signal; and
an automatic gain control coupled to the resonating element and the oscillator, the automatic gain control configured to adjust the gain of the oscillating drive signal based on the signal generated by the resonating element.

2. The control system of claim 1, wherein the resonating element is a micro-electrical-mechanical system (MEMS) and the control system further comprises:
a capacitive-voltage (C/V) converter coupled to the MEMS structure and the phase comparator and configured to convert a change in capacitance of the MEMS structure to a voltage signal; and
a variable gain amplifier (VGA) coupled to the MEMS structure and the oscillator, the VGA configured to adjust the gain of the oscillating drive signal based on the voltage signal.

3. The control system of claim 2, further comprising:
a bandpass filter coupled to the C/V converter and the phase comparator, the bandpass filter configured for filtering out-of-band noise from the voltage signal.

4. The control system of claim 1, further comprising:
a loop filter coupled between the phase comparator and the oscillator.

5. The control system of claim 4, wherein the loop filter is a low pass filter.

6. The control system of claim 1, wherein the oscillator is a voltage controlled oscillator (VCO).

7. A method of controlling a drive signal for a resonating element, the method comprising:
receiving a signal from the resonating element;
comparing a phase of the signal with a phase of an oscillating drive signal;
generating an error signal based on the comparing;
adjusting a phase of the oscillating drive signal based on the error signal;
adjusting a gain of the oscillating drive signal based on an amplitude of the received signal; and
driving the resonating element to its resonant frequency using the oscillating drive signal.

8. The method of claim 7, wherein the received signal is a voltage signal that is generated in response to a change in capacitance induced by the resonating element.

9. The method of claim 8, wherein the voltage signal is filtered before the comparing.

10. The method of claim 7, wherein the error signal is filtered before it is used to adjust the phase of the oscillating drive signal.

11. The method of claim 7, wherein the resonating element is a micro-electrical-mechanical system (MEMS) structure.

12. An apparatus comprising:
a motion sensor including a resonating element;
a control system coupled to the resonating element and configured to:
receive a signal from the resonating element;
compare a phase of the signal with a phase of an oscillating drive signal;
generate an error signal based on the comparing;
adjust a phase of the oscillating drive signal based on the error signal;
adjust a gain of the oscillating drive signal based on an amplitude of the received signal; and
drive the resonating element to its resonant frequency using the oscillating drive signal.

13. The apparatus of claim 12, wherein the resonating element is a micro-electrical-mechanical system (MEMS) and the control system further comprises:
a capacitive-voltage (C/V) converter coupled to the MEMS structure and a phase comparator and configured to convert a change in capacitance of the MEMS structure to a voltage signal; and
a variable gain amplifier (VGA) coupled to the MEMS structure and the oscillator, the VGA configured to adjust the gain of the oscillating drive signal based on the voltage signal.

14. The apparatus of claim 13, further comprising:
a bandpass filter coupled to the C/V converter and the phase comparator, the bandpass filter configured for filtering out-of-band noise from the voltage signal.

15. The apparatus of claim 13, further comprising:
a loop filter coupled between the phase comparator and the oscillator.

16. The apparatus of claim 15, wherein the loop filter is a low pass filter.

17. The apparatus of claim 12, wherein the oscillator is a voltage controlled oscillator (VCO).

18. The apparatus of claim 12, further comprising:
a processor coupled to the motion sensor;
memory coupled to the processor and configured to store instructions, which when executed by the processor, causes the processor to perform operations comprising:
obtaining a motion signal from the motion sensor; and
determining a state of the apparatus based at least in part on the motion signal.

19. The apparatus of claim 18, wherein the motion sensor is an angular rate sensor and the motion signal indicates an angular rate of the apparatus in a reference coordinate frame.

20. The apparatus of claim 19, wherein an orientation of the apparatus in the reference coordinate frame is determined from the angular rate.

\* \* \* \* \*

UNITED STATES PATENT AND TRADEMARK OFFICE
CERTIFICATE OF CORRECTION

PATENT NO. : 9,823,072 B2  
APPLICATION NO. : 14/866561  
DATED : November 21, 2017  
INVENTOR(S) : Gregory B. Arndt and Christopher C. Painter Page 1 of 1

It is certified that error appears in the above-identified patent and that said Letters Patent is hereby corrected as shown below:

In the Claims

Column 5, Line 29, replace "an" with -- the --;

Column 5, Line 36, after "oscillating" add -- drive --; and

Column 5, Line 41, after "based on the" add -- sense --.

Signed and Sealed this  
Fifth Day of June, 2018

Andrei Iancu  
*Director of the United States Patent and Trademark Office*